United States Patent
Lee et al.

(10) Patent No.: US 8,358,558 B2
(45) Date of Patent: Jan. 22, 2013

(54) ADDRESS CONTROL CIRCUIT AND SEMICONDUCTOR MEMORY DEVICE

(75) Inventors: Kyong Ha Lee, Gyeonggi-do (KR); Joo Hyeon Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 309 days.

(21) Appl. No.: 12/824,882

(22) Filed: Jun. 28, 2010

(65) Prior Publication Data

US 2011/0110176 A1 May 12, 2011

(30) Foreign Application Priority Data

Nov. 12, 2009 (KR) ........................ 10-2009-0109370

(51) Int. Cl.
*G11C 8/00* (2006.01)
(52) U.S. Cl. ................................. 365/230.06
(58) Field of Classification Search .............. 365/233.18
See application file for complete search history.

(56) References Cited

U.S. PATENT DOCUMENTS

| | | | | |
|---|---|---|---|---|
| 6,600,342 B1* | 7/2003 | Lee et al. | ...................... | 326/105 |
| 7,602,662 B2 | 10/2009 | Song | | |
| 2001/0000994 A1* | 5/2001 | Tomita et al. | .................. | 365/233 |
| 2001/0043507 A1* | 11/2001 | Ooishi | .......................... | 365/233 |
| 2008/0062774 A1* | 3/2008 | Kwean | ...................... | 365/189.05 |
| 2008/0112251 A1* | 5/2008 | Youn et al. | ............... | 365/230.03 |
| 2009/0003122 A1* | 1/2009 | Lee | .......................... | 365/230.08 |
| 2010/0250874 A1* | 9/2010 | Farrell et al. | .................. | 711/155 |

FOREIGN PATENT DOCUMENTS

KR    102000038777 A    7/2000

* cited by examiner

*Primary Examiner* — Hoai V Ho
*Assistant Examiner* — Min Huang
(74) *Attorney, Agent, or Firm* — Ladas & Parry LLP

(57) ABSTRACT

An address control circuit is presented for use in reducing a skew in a write operation mode. The address control circuit includes a read column address control circuit and a write column address control circuit. The read column address control circuit is configured to generate a read column address from an address during a first burst period for a read operation mode. The write column address control circuit is configured to generate a write column address from the address during a second burst period for a write operation mode.

28 Claims, 11 Drawing Sheets

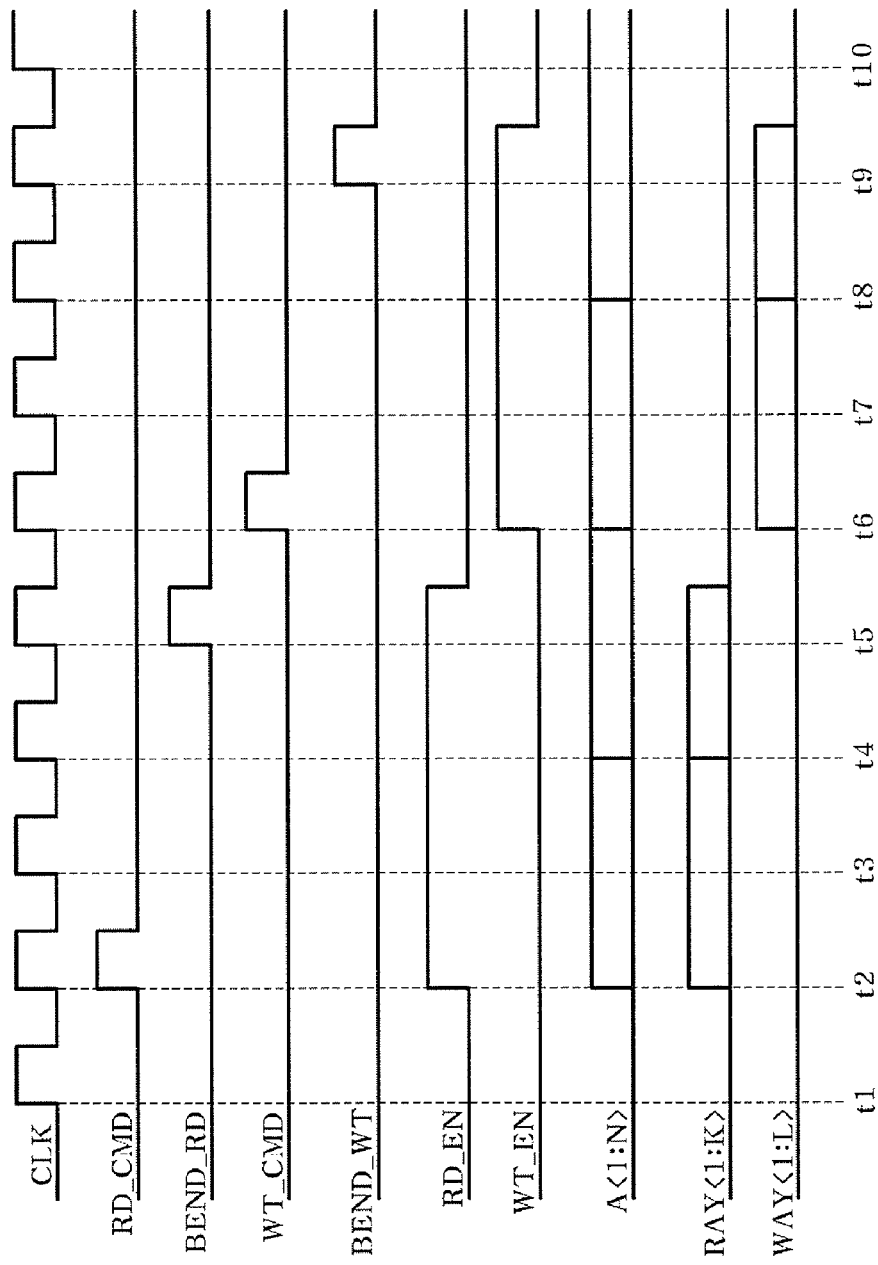

ADDRESS CONTROL CIRCUIT AND SEMICONDUCTOR MEMORY DEVICE

CROSS-REFERENCE TO RELATED APPLICATIONS

The present application claims priority under 35 U.S.C 119(a) to Korean Application No. 10-2009-109370, filed on Nov. 12, 2009, in the Korean Intellectual Property Office, which is incorporated by reference in its entirety as set forth in full.

BACKGROUND

The present invention relates to a semiconductor memory device, and more particularly, to an address control circuit employed in a semiconductor memory device.

Dynamic random access memory (DRAM) devices are usually operated on using typical signal paths such as a row address path, a column address path and a data path. Usually on the row address path, there are operations that extract a row address from an address supplied externally, select a word line by the row address, and amplify data of a memory cell, which is coupled to the selected word line, by a sense amplifier. Usually on the column address path, there are operations for extracting a column address from an address that is supplied externally by a column address control circuit (hereinafter, referred to as 'column address control operation'), decoding the column address, and selecting a memory cell by an output enable signal that is selectively activated. Usually on the data path, there are operations for outputting data through bit lines to an external system in response to a selected output enable signal or for storing external data in a memory cell through a bit line.

In general semiconductor memory devices, pads through which addresses, commands and data are input and output are generally placed at the centers of chips of the semiconductor memory devices. But, in other semiconductor memory devices for mobile apparatuses, pads are disposed along the edges of the chips thereof. For example, while pads receiving an address and a command are placed at one edge of a semiconductor memory device chip, pads through which data are input/output are placed at the other edge of the chip.

FIG. 1 shows a semiconductor memory device having a general column address control circuit.

In the semiconductor memory device of FIG. 1, a command address input circuit 100, which includes receiving pads that receive an address and a command, is placed at the opposite edge region of a data input/output circuit 101, which includes I/O pads through which data are input/output, interposed by a memory cell array of banks BANK1~BANK8. The edge region where the command address input circuit 100 is placed also includes a column address control circuit 102 that functions for column address control operations to extract a column address AY from an address A provided from the command address input circuit 100.

With this structure of the semiconductor memory device, in a read operation mode for the first bank BANK1, the column address AY generated from the column address control circuit 102 is used to select a first memory cell C1 through a first column address path CAP1 and then data is output from the first memory cell C1 to the data input/output circuit 101 by way of a first data path DP1. In a read operation mode for the eighth bank BANK8, the column address AY generated from the column address control circuit 102 is used to select a second memory cell C2 through a second column address path CAP2 and then data is output from the second memory cell C2 to the data input/output circuit 101 by way of a second data path DP2. In the read operation mode, the column address path is the same as the data path in the progress direction.

Meantime, in a write operation mode for the first bank BANK1, the column address AY generated from the column address control circuit 102 is used to select the first memory cell C1 through the first column address path CAP1 and then data DIN supplied into the data input/output circuit 101 is stored in the first memory cell C1 by way of a third data path DP3. During this operation, there is a skew between transmission times of the column address AY and the input data DIN because the first column address path CAP1 is shorter than the third data path DP3.

Further, in a write operation mode for the eighth bank BANK8, the column address AY generated from the column address control circuit 102 is used to select the second memory cell C2 through the second column address path CAP2 and then data DIN supplied into the data input/output circuit 101 is stored in the second memory cell C2 by way of a fourth data path DP4. During this operation, there is a skew between transmission times of the column address AY and the input data DIN because the fourth data path DP4 is shorter than the second column address path CAP3.

SUMMARY

Accordingly, embodiments of the present invention are directed to an address control circuit reducing a skew in a write operation mode, and a semiconductor memory device including the address control circuit.

In an embodiment, an address control circuit may include: a read column address control circuit configured to generate a read column address from an address during a first burst period for a read operation mode; and a write column address control circuit configured to generate a write column address from the address during a second burst period for a write operation mode.

In another embodiment, a semiconductor memory device may include: a command address input circuit including a receiving pad receiving a command and an address; a data input/output circuit including a I/O pad to/from which data is input/output; and a write column address control circuit disposed at the same edge region with the data input/output circuit and configured to a write column address from an address provided from the command address input circuit during a burst period for a write operation mode.

In still another embodiment, a semiconductor memory device may be comprised of: a command address input circuit including a receiving pad receiving a command and an address; a data input/output circuit including a I/O pad from which data is input/output; a read column address control circuit configured to generate a read column address from an address provided from the command address input circuit during a first burst period for a read operation mode; and a write column address control circuit configured to generate a write column address from an address provided from the command address input circuit during a second burst period for a write operation mode.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which:

FIG. 11 is a timing diagram illustrating a column address control operation of the semiconductor memory device shown in FIG. 2.

DESCRIPTION OF EMBODIMENTS

Hereinafter, various embodiments will now be described more fully with reference to the accompanying drawings in which some embodiments are shown. However, specific structural and functional details disclosed herein are merely representative for purposes of describing embodiments of the present invention. Like numbers refer to like elements throughout the description of the drawings.

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe embodiments, various aspects will be hereinafter described in detail with reference to the attached drawings.

Figure 1:
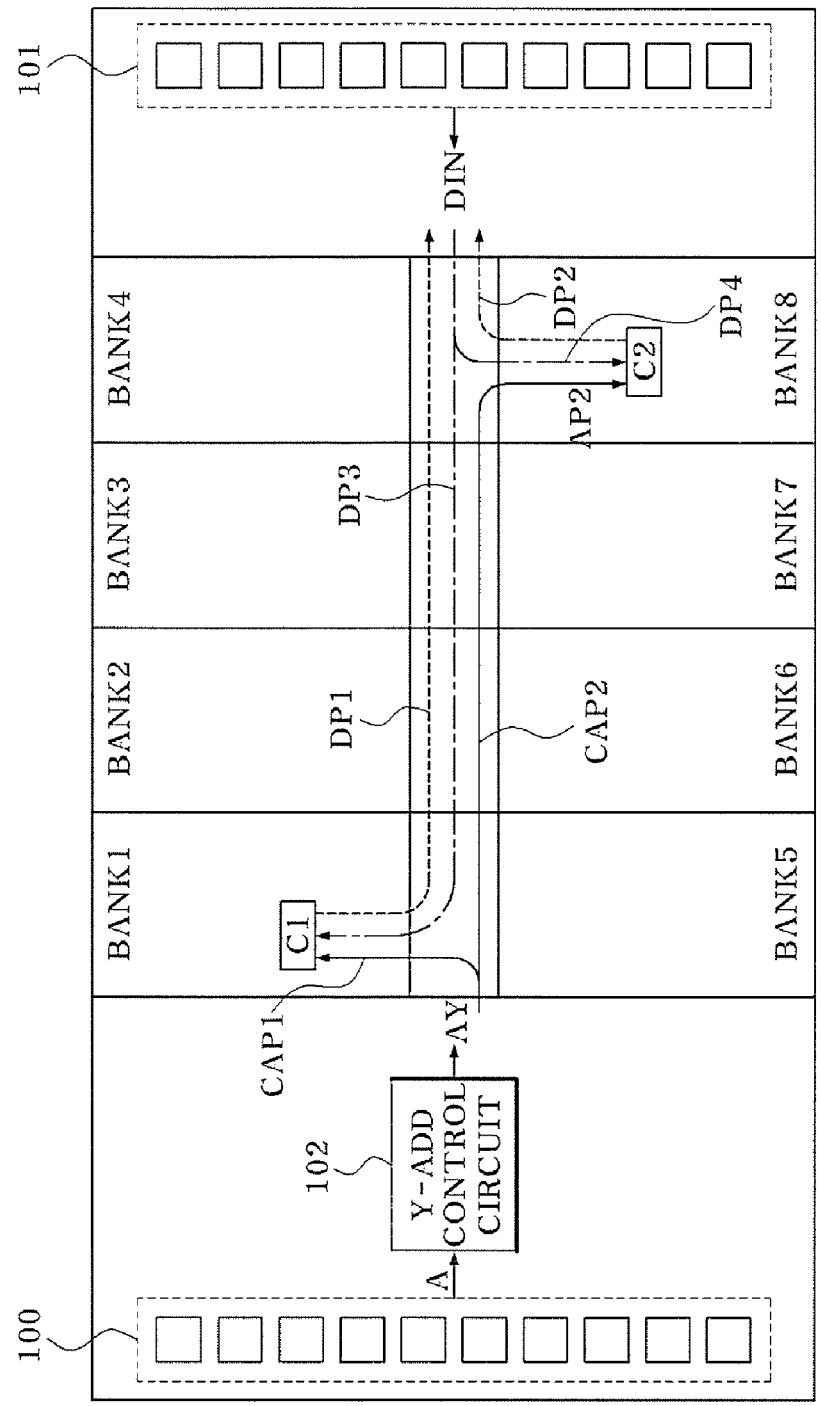
FIG. 1 is a schematic diagram of a semiconductor memory device having a general column address control circuit.
Figure 2:
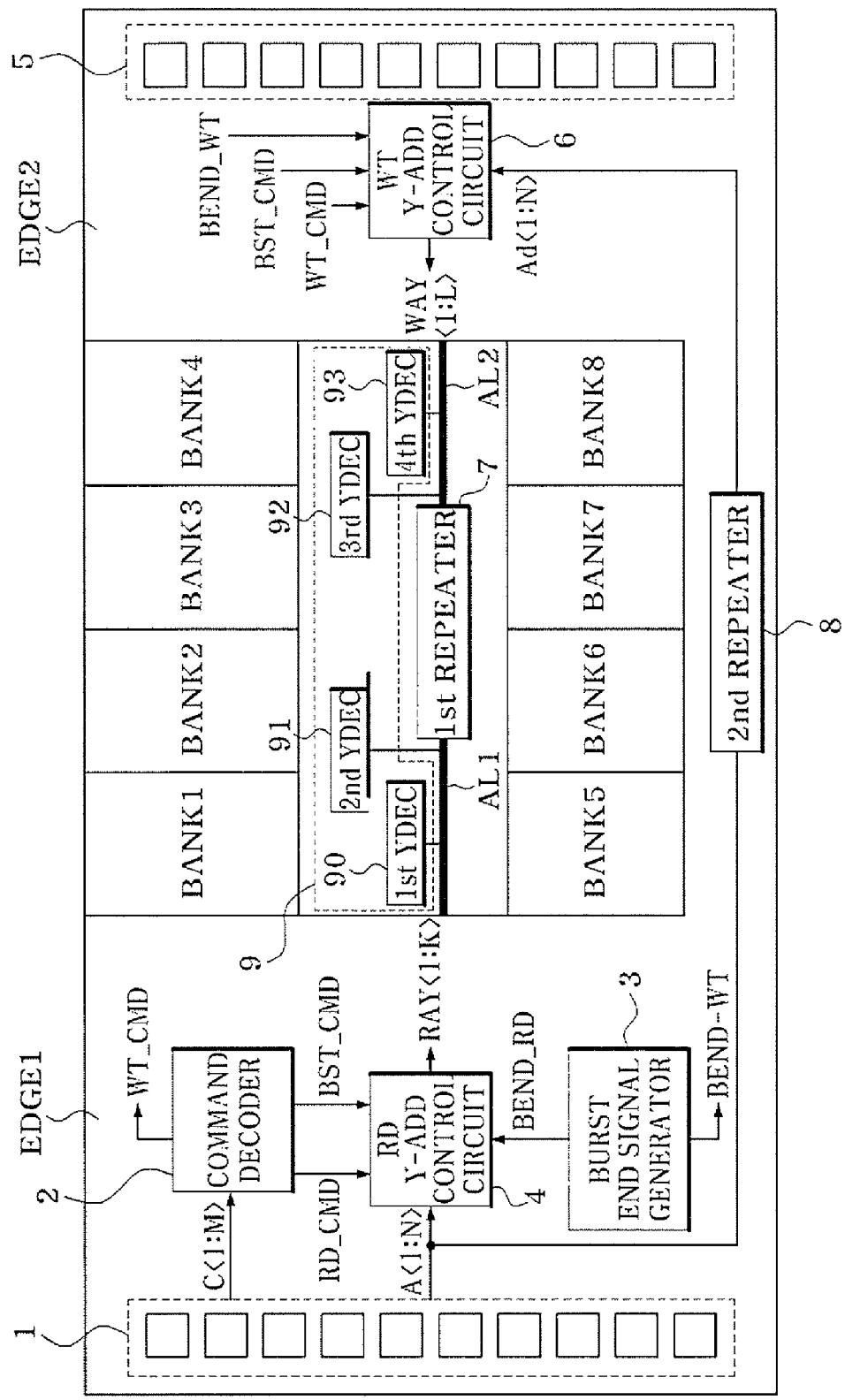
FIG. 2 is a block diagram illustrating a semiconductor memory device conducting a column address control operation according to an embodiment of the present invention.

FIG. 2 illustrates a block configuration of a semiconductor memory device conducting a column address control operation according to an embodiment of the present invention.

Referring to FIG. 2, the semiconductor memory device according to this embodiment of the present invention is exemplarily comprised of a command address input circuit 1, a command decoder 2, a burst end signal generator 3, a read column address control circuit 4, a data input/output circuit 5, a write column address control circuit 6, a first repeater 7, a second repeater 8 and a column decoder 9.

The command address input circuit 1 is placed at a first edge region EDGE1 and may be composed of plural receiving pads and input buffers (not shown). The receiving pads are configured to receive an external address and an external command. Input buffers (not shown) are configured to buffer the external address and the external command which are received through the I/O pads, by outputting an address $A<1:N>$ and a command $C<1:M>$. In a low-power double data rate 2 (LPDDR2) DRAM, an external address and an external command are input as a single command address signal that is divided into an address $A<1:N>$ and a command $C<1:M>$ in response to a rising or falling edge of a clock.

The command decoder 2 decodes the command $C<1:M>$ and generates a read command RD_CMD, a write command WT_CMD and a burst command BST_CMD. The read command RD_CMD is a signal that is applied in a pulse pattern for a read operation mode. The write command WT_CMD is a signal that is applied in a pulse pattern for a write operation mode. The burst command BST_CMD acts as an interrupt signal that is applied in a pulse pattern for suspending a burst operation in a read burst period for the read operation mode and in a write burst period for the write operation mode. The command decoder 2 is placed at a first edge region EDGE1.

The burst end signal generator 3 is configured to generate a read burst end signal BEND_RD and a write burst end signal BEND_WT which appear in pulse patterns at times according to burst lengths determined by a mode register set (MRS) that is executed at the initial operation of the semiconductor memory device. For instance, when a burst length is set to 8, the pulse pattern of the read burst end signal BEND_RD is generated after three cycles of a clock CLK subsequent to an input of the read command RD_CMD and the pulse pattern of the write burst end signal BEND_WT is generated after three cycles of the clock CLK subsequent to an input of the write command WT_CMD. The burst end signal generator 3 is placed at the first edge region EDGE1.

Figure 3:
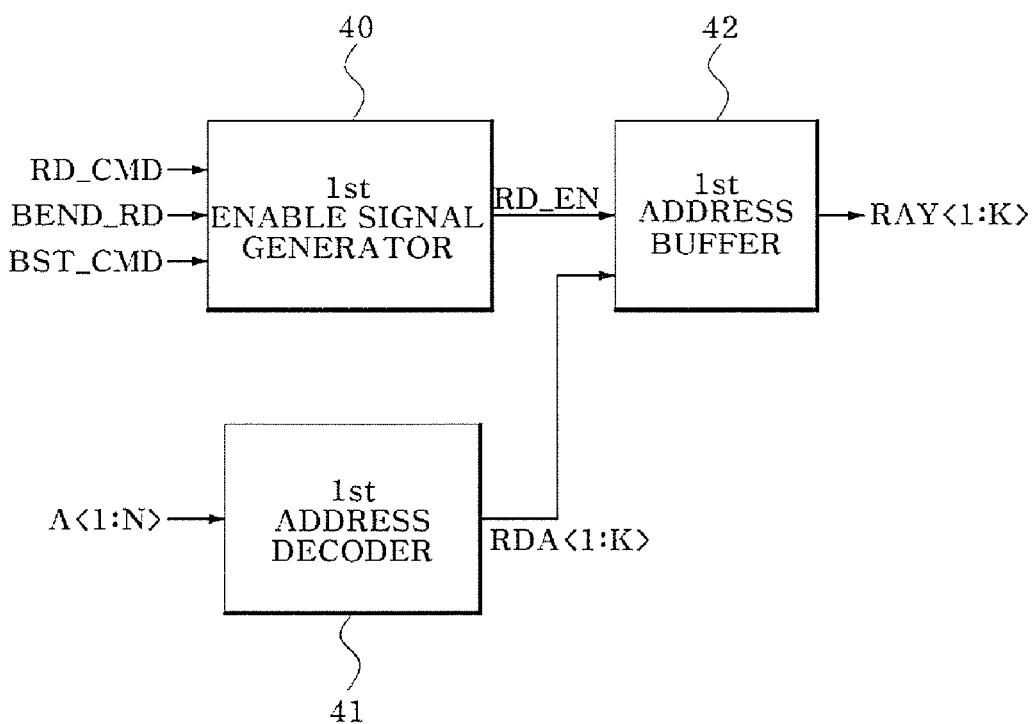
FIG. 3 is a block diagram illustrating a read column address control circuit included in the semiconductor memory device shown in FIG. 2.

Now referring to FIG. 3, the read column address control circuit 4 may be comprised of a first enable signal generator 40, a first address decoder 41 and a first address buffer 42. The first enable signal generator 40 is configured to generate a read enable signal RD_EN, which is activated in a high level state during a read burst period for the read operation mode, in response to receiving the read command RD_CMD, the read burst end signal BEND_RD and the burst command BST_CMD. The first address decoder 41 is configured to generate a decoded read address $RDA<1:K>$ by decoding the address $A<1:N>$. The first address buffer 42 is configured to output a read column address $RAY<1:K>$ by buffering the decoded read address $RDA<1:K>$ in response to the read enable signal RD_EN during the read burst period. The read column address control circuit 4 is placed at the first edge region EDGE1.

Figure 4:
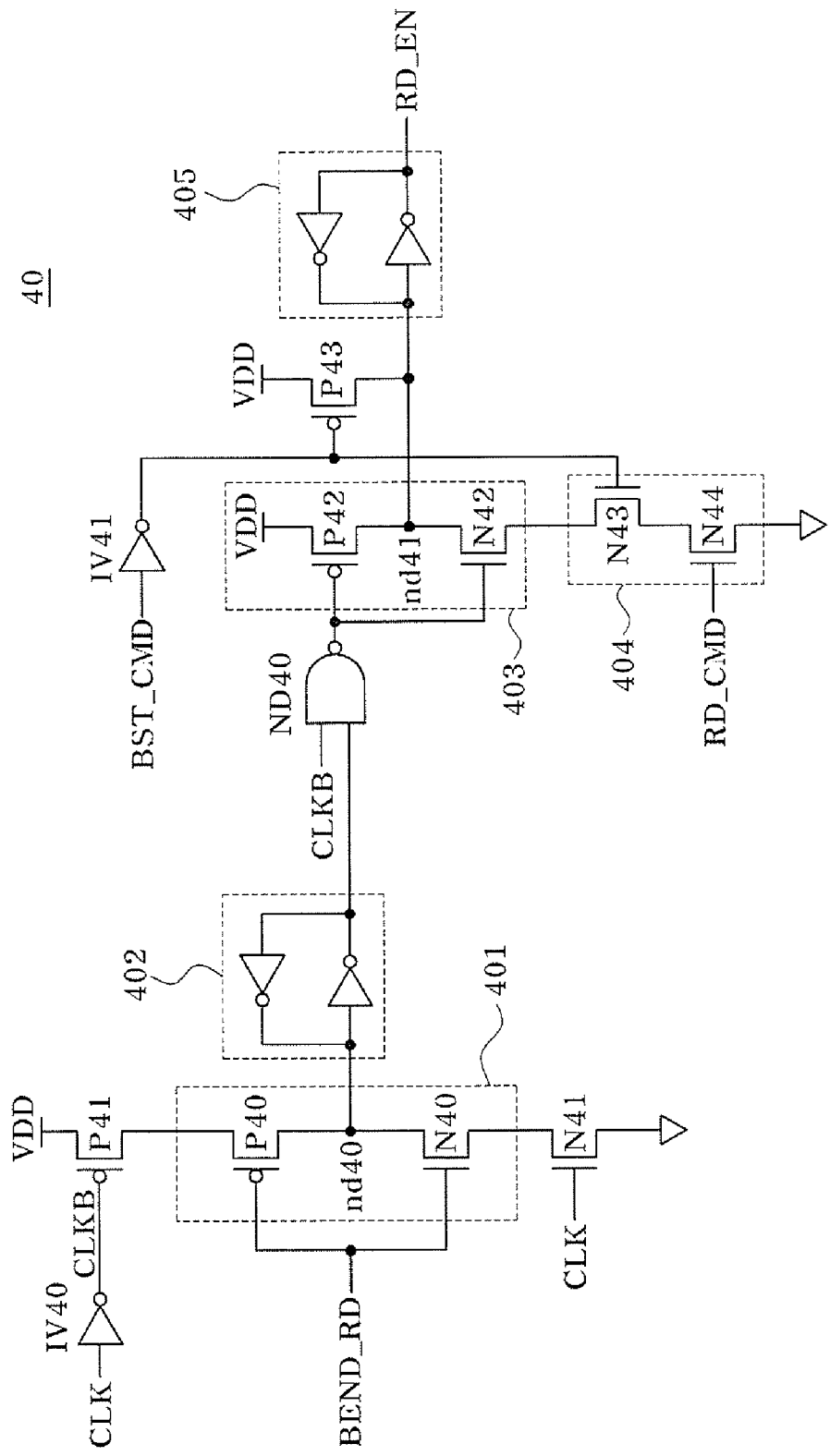
FIG. 4 is an equivalent circuit diagram illustrating a first enable signal generator included in the read column address control circuit shown in FIG. 3.

Referring to FIG. 4, the first enable signal generator 40 may be composed of a first buffer 401, PMOS P41 and NMOS N41 transistors, a first latch 402, a NAND gate ND40, a second buffer 403, a switching circuit 404, a PMOS transistor P43 and a second latch 405. The first buffer 401 is exemplary formed of PMOS P40 and NMOS N40 transistors which operate to drive a node nd40 in response to the read burst end signal BEND_RD. The PMOS P41 and NMOS N41 transistors constitute a switch configured to control the first buffer 401 to be driven in response to the clock CLK. The first latch 402 holds a signal of the node nd40. The NAND gate ND40 functions as a transmission gate configured to buffer and transfer an output signal of the first latch 402 in response to an inverted clock CLKB. The second buffer 403 is exemplarily formed of PMOS P42 and NMOS N42 transistors which are configured to drive a node nd41 in response to an output signal of the NAND gate ND40. The switching circuit 404 is exemplarily formed of NMOS transistors N43 and N44 which are turned on in response to the burst command BST_CMD and the read command RD_CMD respectively and control the second buffer 403 to be driven. The PMOS transistor P43 functions as a driving element configured to raise a voltage of the node nd41. The second latch 405 holds a signal of the node nd41 and outputs the read enable signal RD_EN.

With this structural configuration of the first enable signal generator 40, when the read command RD_CMD is input with a high level pulse in the condition that the read burst end signal BEND_RD or the burst command BST_CMD is in a low level state, the NMOS transistor N42 of the second buffer 403 and the NMOS transistors N43 and N44 of the switching circuit 404 are turned on to generate the read enable signal RD_EN in a high level state. In this condition, when the read burst end signal BEND_RD is input in as a high level pulse, the PMOS transistor P42 of the second buffer 403 is turned on to inactivate the read enable signal RD_EN into a low level state. Subsequently, responding to a high level pulse of the burst command BST_CMD, the PMOS transistor P43 is turned on to make the read enable signal RD_EN inactivated into a low level state.

Figure 5:
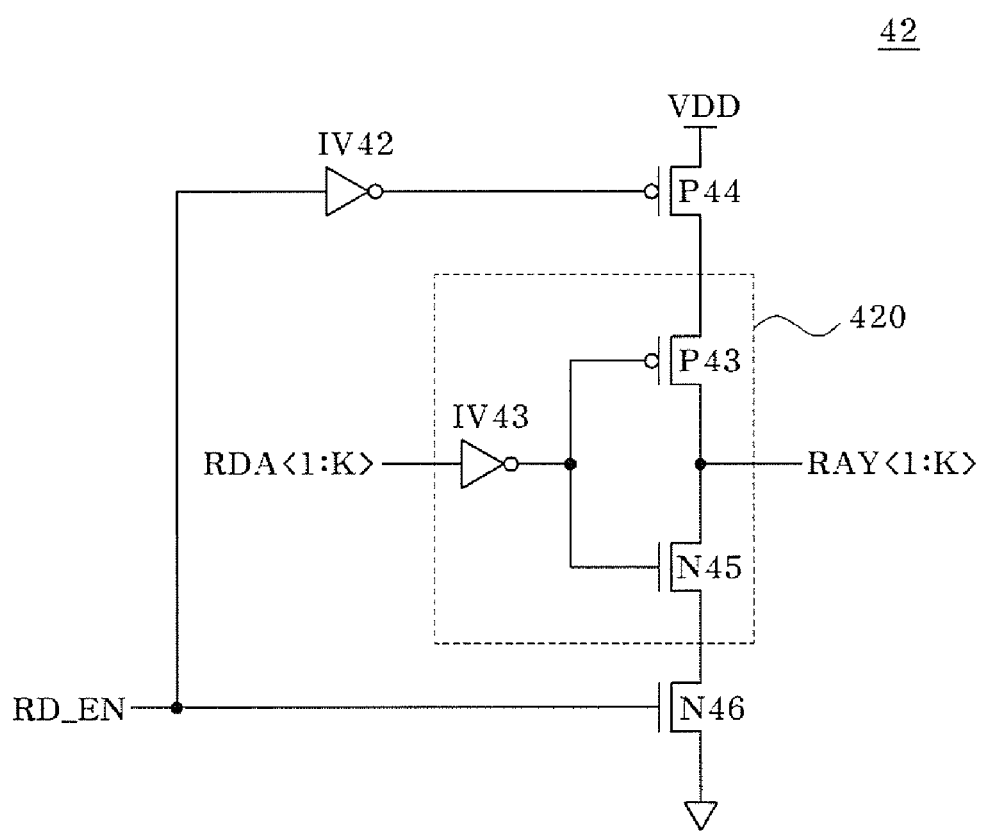
FIG. 5 is an equivalent circuit diagram illustrating a first address buffer included in the read column address control circuit shown in FIG. 3.

Referring to FIG. 5, the first address buffer 42 is exemplarily composed of an inverter IV43, a first buffer 420, and PMOS P44 and NMOS N46 transistors. The inverter IV43 buffers the decoded read address RDA<1:K> used for generating the read column address RAY<1:K>. The first buffer 420 is formed of a PMOS transistor P43 and an NMOS transistor N45. The PMOS P44 and NMOS N46 transistors constitute a switching element configured to control the first buffer 420 to be driven in response to the read enable signal RD_EN. With this configuration, the first address buffer 42 generates the read column address RAY<1:K> from the decoded read address RDA<1:K> by driving the first buffer 420 during the read burst period when the read enable signal RD_EN is active in a high level state.

The data input/output circuit 5 is disposed in the second edge region EDGE2 and is exemplarily formed of plural I/O pads 112, data input buffers (not shown) and data output buffers (not shown). The data input buffer may be configured to buffer data that are input through the I/O pads 112. The data output buffers may be configured to buffer and output data to the I/O pads 112.

Figure 6:
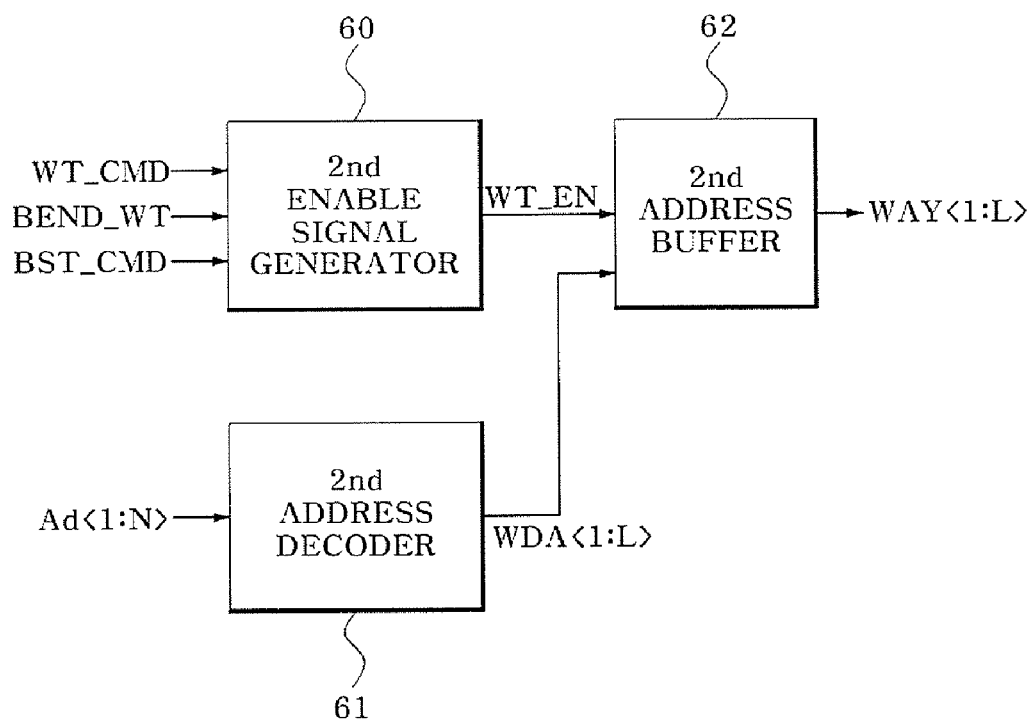
FIG. 6 is a block diagram illustrating a write column address control circuit included in the semiconductor memory device shown in FIG. 2.

Now referring to FIG. 6, the write column address control circuit 6 may be comprised of a second enable signal generator 60, a second address decoder 61 and a second address buffer 62. The second enable signal generator 60 is configured to generate a write enable signal WT_EN, which is activated in a high level state during a write burst period for the write operation mode, in response to receiving the write command WT_CMD, the write burst end signal BEND_WT and the burst command BST_CMD. The second address decoder 61 is configured to generate a decoded write address WDA<1:L> by decoding a repeated address Ad<1:N>. The second address buffer 62 is configured to output a write column address WAY<1:L> by buffering the decoded write address WDA<1:L> in response to the write enable signal WT_EN during the write burst period. The write column address control circuit 6 is placed at the second edge region EDGE2.

Figure 7:
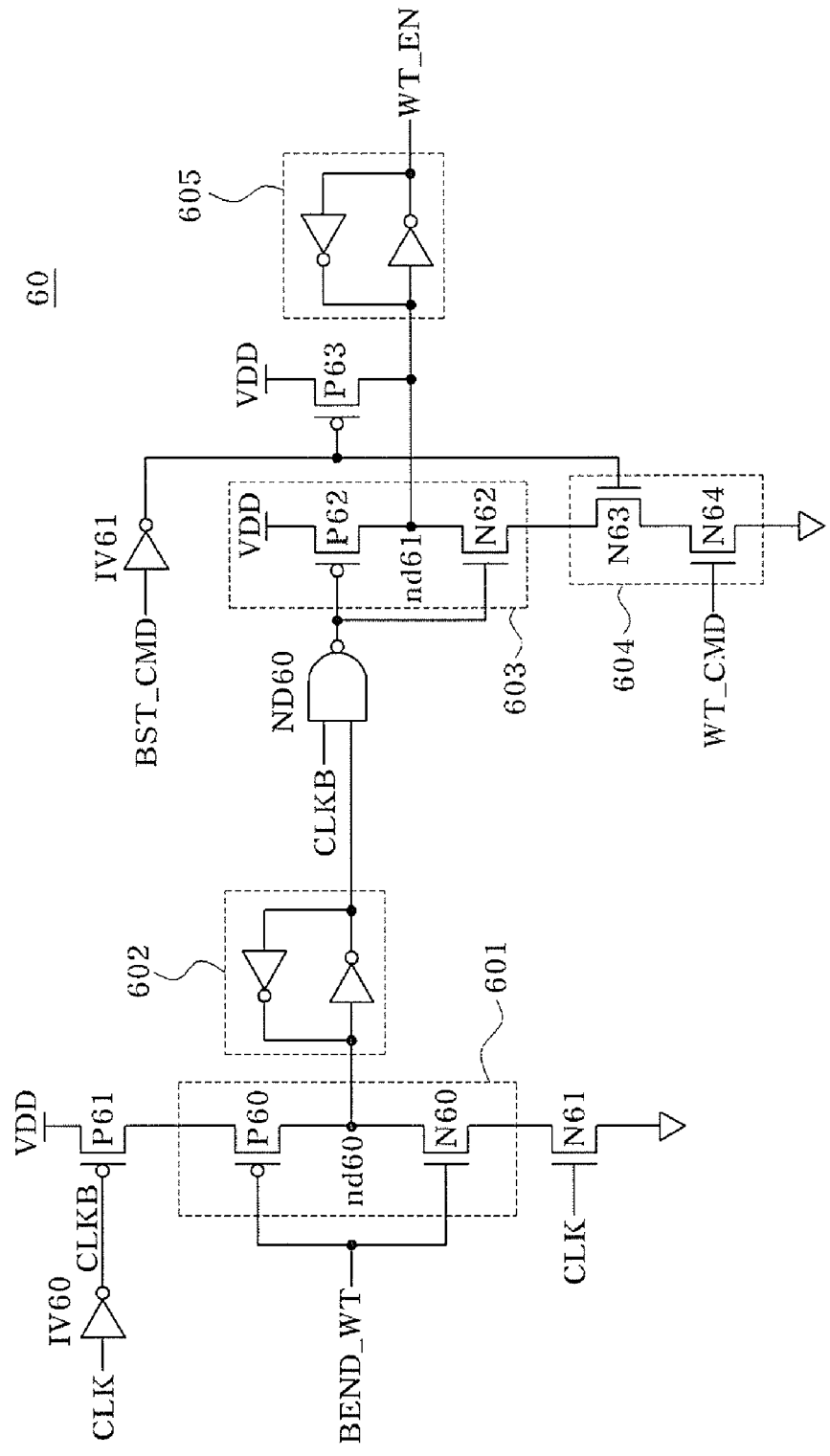
FIG. 7 is an equivalent circuit diagram illustrating a second enable signal generator included in the write column address control circuit shown in FIG. 6.

Referring to FIG. 7, the second enable signal generator 60 may be composed of a third buffer 601, PMOS P61 and NMOS N61 transistors, a third latch 602, a NAND gate ND60, a fourth buffer 603, a switching circuit 604, a PMOS transistor P63 and a fourth latch 605. The third buffer 601 is exemplary formed of PMOS P60 and NMOS N60 transistors which operate to drive a node nd60 in response to the write burst end signal BEND_WT. The PMOS P61 and NMOS N61 transistors constitute a switch configured to control the third buffer 601 to be driven in response to the clock CLK. The third latch 602 operates to hold a signal of the node nd60. The NAND gate ND60 functions as a transmission gate configured to buffer and transfer an output signal of the third latch 602 in response to the inverted clock CLKB. The fourth buffer 603 is exemplarily formed of PMOS P62 and NMOS N62 transistors which are configured to drive a node nd61 in response to an output signal of the NAND gate ND60. The switching circuit 604 is exemplarily formed of NMOS transistors N63 and N64 which are turned on in response to the burst command BST_CMD and the write command WT_CMD respectively and control the fourth buffer 603 to be driven. The PMOS transistor P63 functions as a driving element configured to raise a voltage of the node nd61. The fourth latch 605 operates to hold a signal of the node nd61 and outputs the write enable signal WT_EN.

With this structural configuration of the second enable signal generator 60, when the write command WT_CMD is input as a high level pulse in the condition that the write burst end signal BEND_WT or the burst command BST_CMD are in a low level state, the NMOS transistor N62 of the fourth buffer 603 and the NMOS transistors N63 and N64 of the switching circuit 604 are turned on to generate the write enable signal WT_EN in a high level state. In this condition, when the write burst end signal BEND_WT is input in a high level pulse, the PMOS transistor P62 of the fourth buffer 603 is turned on to inactivate the write enable signal WT_EN to a low level state. Subsequently, responding to a high level pulse of the burst command BST_CMD, the PMOS transistor P63 is turned on to make the write enable signal WT_EN inactivated to a low level state.

Figure 8:
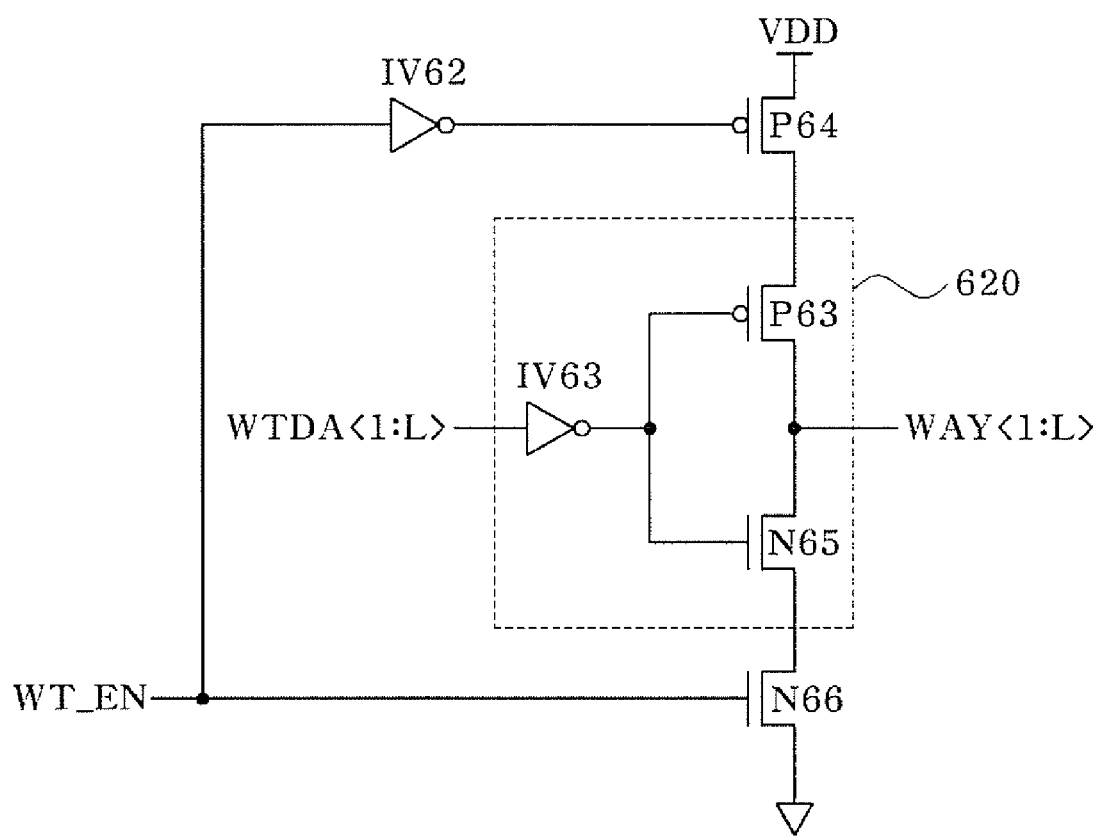
FIG. 8 is an equivalent circuit diagram illustrating a second address buffer included in the write column address control circuit shown in FIG. 6.

Referring to FIG. 8, the second address buffer 62 is exemplarily composed of an inverter IV63, a second buffer 620, and PMOS P64 and NMOS N66 transistors. The inverter IV63 operates to buffer the decoded write address WDA<1:L> used for generating the write column address WAY<1:L>. The second buffer 620 is formed of PMOS P63 and NMOS N65 transistors. The PMOS P64 and NMOS N66 transistors constitute a switching element configured to control the second buffer 620 to be driven in response to the write enable signal WT_EN. With this configuration, the second address buffer 62 generates the write column address WAY<1:L> from the decoded write address WDA<1:L> by driving the second buffer 620 during the write burst period for which the write enable signal WT_EN is being active in a high level state.

Figure 9:
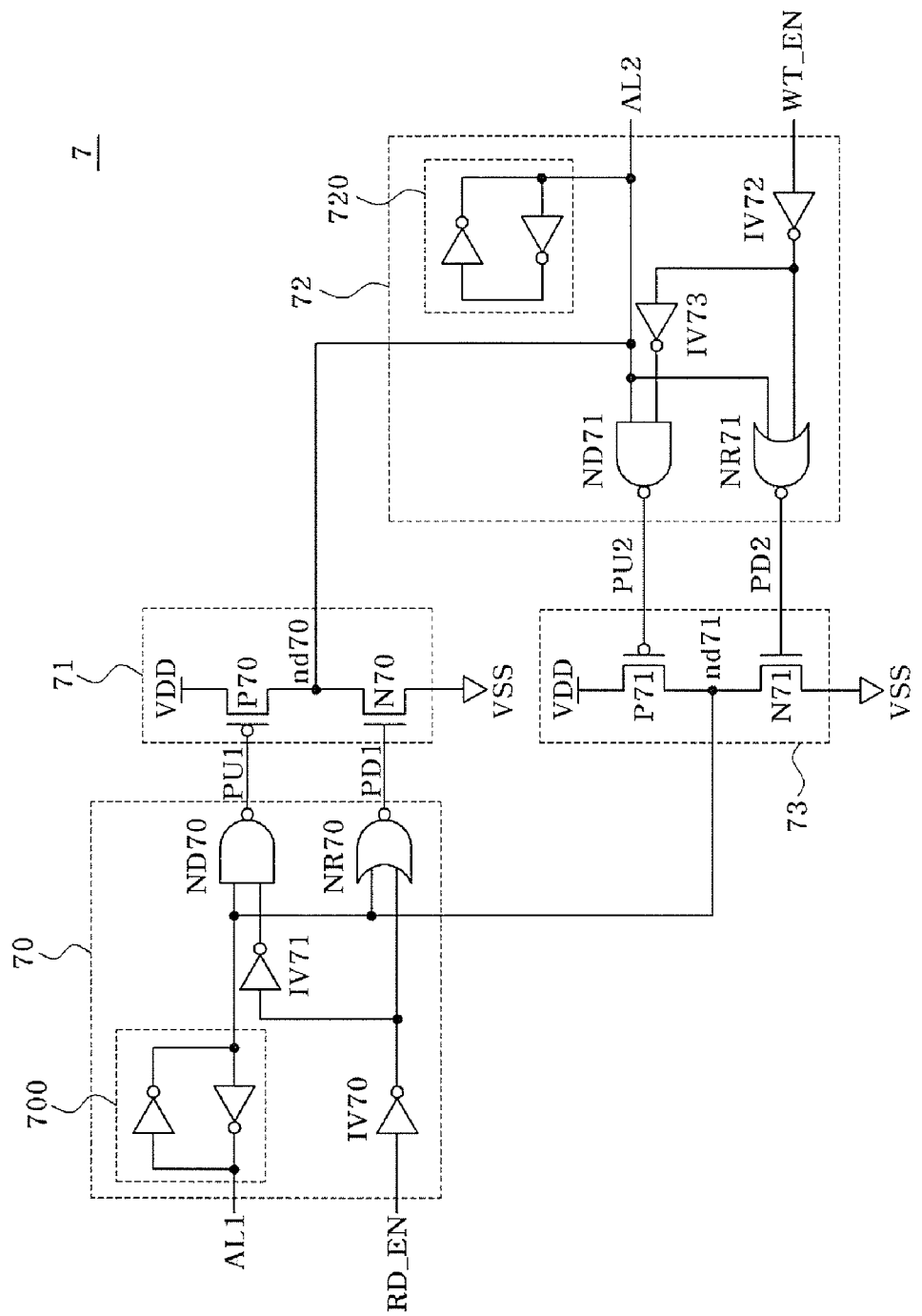
FIG. 9 is an equivalent circuit diagram illustrating a first repeater included in the semiconductor memory device shown in FIG. 2.

Referring to FIG. 9, the first repeater 7 may be organized to include a first drive signal generator 70, a first driver 71, a second drive signal generator 72 and a second driver 73. The first drive signal generator 70 is exemplarily formed of a fifth latch 700, a NAND gate ND70 and a NOR gate NR70. The fifth latch 700 operates to hold a signal of a first address line AL1. The NAND gate ND70 generates a first pull-up signal PU1 by a not-AND operation with a signal that is provided from the first address line AL1 through the fifth latch 700 and a signal that is buffered from the read enable signal RD_EN through inverters IV70 and IV71. The NOR gate NR70 generates a first pull-down signal PD1 by a not-OR operation with a signal that is provided from the first address line AL1 through the fifth latch 700 and a signal that is inverted from the read enable signal RD_EN through the inverter IV70. Here, the first address line AL1 receives the read column address RAY<1:K> in the read operation mode. In the write operation mode, the first address line AL1 receives the write column address WAY<1:L> that has passed through the first repeater 7.

With this configuration, the first drive signal generator 70 generates the first pull-up signal PU1 that is activated in a low level state, and the first pull-down signal PD1 that is inactivated in a low level state, when the read column address RAY<1:K> is in a high level state during the read burst period for which the read enable signal ED_EN is set on a high level state. When the read column address RAY<1:K> is in a low level state, the first drive signal generator 70 outputs the first pull-up signal PU1 that is inactivated in a high level state, and the first pull-down signal PD1 that is activated in a high level state.

The first driver 71 is exemplarily formed of a PMOS transistor P70 and an NMOS transistor N70. The PMOS transistor P70 functions as a pull-up element configured to raise a voltage of a node nd70 in response to the first pull-up signal PU1. The NMOS transistor N70 functions as a pull-down element configured to decrease a voltage of the node nd70 in response to the first pull-down signal PD1. With this configuration, the first driver 71 operates to raise a voltage of the node nd70 to a high level state by the PMOS transistor P70 turned on in response to receiving the first pull-up signal PU1 that is activated to a low level state when the read column address RAY<1:K> is in a high level state. When the read column address RAY<1:K> is in a low level state, the first driver 71 operates to decrease a voltage of the node nd70 to a low level state by the NMOS transistor N70 which is turned on in response to receiving the first pull-down signal PD1 that is activated to a low level state.

The second drive signal generator 72 is exemplarily formed of a sixth latch 720, a NAND gate ND71 and a NOR gate NR71. The sixth latch 720 operates to hold a signal of a second address line AL2. The NAND gate ND71 generates a second pull-up signal PU2 by a not-AND operation with a signal that is provided from the second address line AL2 through the sixth latch 720 and a signal that is buffered from the write enable signal WT_EN through inverters IV72 and IV73. The NOR gate NR71 generates a second pull-down signal PD2 by a not-OR operation with a signal that is provided from the second address line AL2 through the sixth latch 720 and a signal that is inverted from the write enable signal WT_EN through the inverter IV72. Here, the second address line AL2 receives the write column address WAY<1:L> in the write operation mode. In the read operation mode, the second address line AL2 receives the read column address RAY<1:K> that has passed through the first repeater 7.

With this configuration, the second drive signal generator 72 generates the second pull-up signal PU2 that is activated in a low level state, and the second pull-down signal PD2 that is inactivated in a low level state, when the write column address WAY<1:L> is in a high level state during the write burst period for which the write enable signal WT_EN is set on a high level state. When the write column address WAY<1:L> is in a low level state, the second drive signal generator 72 outputs the second pull-up signal PU2 that is inactivated in a high level state, and the second pull-down signal PD2 that is activated in a high level state.

The second driver 73 is exemplarily formed of a PMOS transistor P71 and an NMOS transistor N71. The PMOS transistor P71 functions as a pull-up element configured to raise a voltage of a node nd71 in response to the second pull-up signal PU2. The NMOS transistor N71 functions as a pull-down element configured to decrease a voltage of the node nd71 in response to the second pull-down signal PD2. With this configuration, the second driver 73 operates to raise a voltage of the node nd71 to a high level state by the PMOS transistor P71 turned on in response to receiving the second pull-up signal PU2 that is activated to a low level state when the write column address WAY<1:L> is in a high level state. When the write column address WAY<1:L> is in a low level state, the second driver 73 operates to decrease a voltage of the node nd71 to a low level state by the NMOS transistor N71 turned on in response to receiving the second pull-down signal PD2 that is activated to a low level state.

Figure 10:
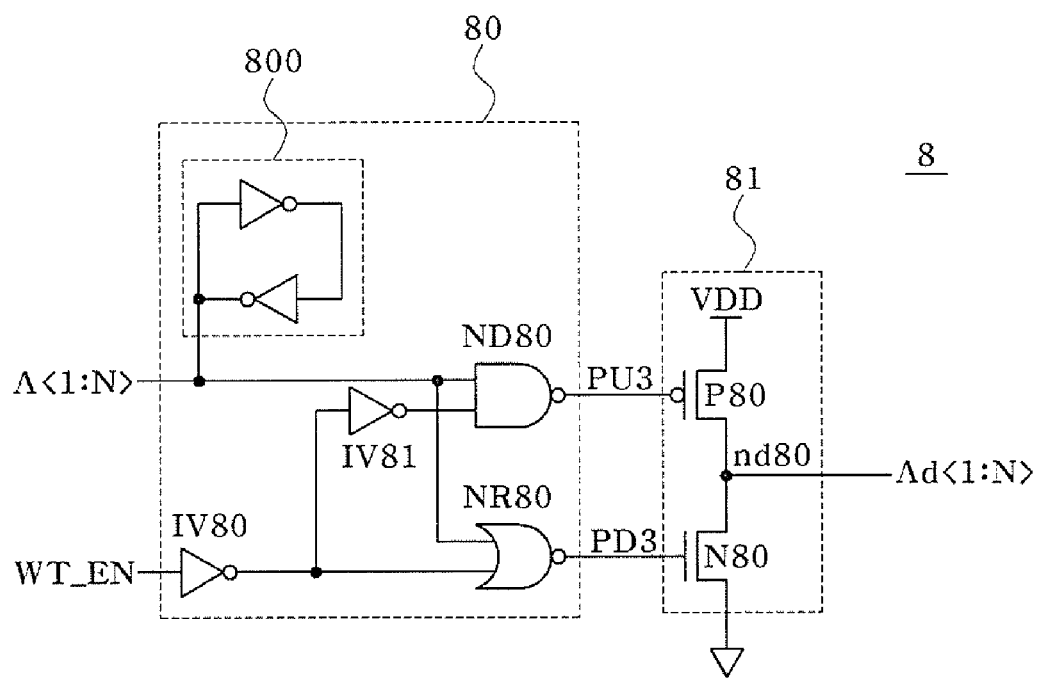
FIG. 10 is an equivalent circuit diagram illustrating a second repeater included in the semiconductor memory device shown in FIG. 2.

Referring to FIG. 10, the second repeater 8 may be organized of include a third drive signal generator 80 and a third driver 81.

The third drive signal generator 80 is exemplarily formed of a seventh latch 800, a NAND gate ND80 and a NOR gate NR80. The seventh latch 800 operates to hold the address A<1:N> provided from the command address input circuit 1. The NAND gate ND80 generates a third pull-up signal PU3 by a not-AND operation with the address A<1:N> and a signal that is buffered from the write enable signal WT_EN through inverters IV80 and IV81. The NOR gate NR80 generates a third pull-down signal PD3 by a not-OR operation with the address A<1:N> and a signal that is inverted from the write enable signal WT_EN through the inverter IV80. With this configuration, the third drive signal generator 80 generates the third pull-up signal PU3 that is activated in a low level state, and the third pull-down signal PD3 that is inactivated in a low level state, when the address A<1:N> is in a high level state during the write burst period for which the write enable signal WT_EN is set on a high level state. When the address A<1:N> is in a low level state, the third drive signal generator 80 outputs the third pull-up signal PU3 that is inactivated in a high level state, and the first pull-down signal PD3 that is activated in a high level state.

The third driver 81 is exemplarily formed of a PMOS transistor P80 and an NMOS transistor N80. The PMOS transistor P80 functions as a pull-up element configured to raise a voltage of a node nd80 in response to the third pull-up signal PU3. The NMOS transistor N80 functions as a pull-down element configured to decrease a voltage of the node nd80, from which the repeated address Ad<1:N> is output, in response to the third pull-down signal PD3. With this configuration, the third driver 81 operates to raise a voltage level of the repeated address Ad<1:N> to a high level state by the PMOS transistor P80 turned on in response to receiving the third pull-up signal PU3 that is activated to a low level state when the address A<1:N> is in a high level state. When the address A<1:N> is in a low level state, the third driver 81 operates to decrease a voltage level of the repeated address Ad<1:N> to a low level state by the NMOS transistor N80 turned on in response to receiving the third pull-down signal PD3 that is activated to a low level state.

The column decoder 9 may be composed of first through fourth decoders 90~93. The first decoder 90 is coupled to the first address line AL1 and configured to generate an output enable signal for selecting a memory cell of the first bank BANK1 or the fifth bank BANK5 by receiving the read column address RAY<1:K> in the read operation mode and by receiving the write column address WAY<1:L> that has passed through the first repeater 7 in the write operation mode. The second decoder 91 is coupled to the first address line AL1 and configured to generate an output enable signal for selecting a memory cell of the second bank BANK2 or the sixth bank BANK6 by receiving the read column address RAY<1:K> in the read operation mode and by receiving the write column address WAY<1:L> that has passed through the first repeater 7 in the write operation mode. The third decoder 92 is coupled to the second address line AL2 and configured to generate an output enable signal for selecting a memory cell of the third bank BANK3 or the seventh bank BANK7 by receiving the write column address WAY<1:L> in the write operation mode and by receiving the read column address RAY<1:K> that has passed through the first repeater 7 in the read operation mode. The fourth decoder 93 is coupled to the second address line AL2 and configured to generate an output enable signal for selecting a memory cell of the fourth bank BANK4 or the eighth bank BANK8 by receiving the write column address WAY<1:L> in the write operation mode and by receiving the read column address RAY<1:K> that has passed through the first repeater 7 in the read operation mode.

Now hereinafter, a column address control operation of the semiconductor memory device shown in FIG. 2 will be described with reference to FIG. 11, while assuming that the burst length is set to 8.

First, when a high level pulse of the read command RD_CMD is input at a time t2, the first enable signal generator 40 activates the read enable signal RD_EN to a high level state.

Next, according as the burst length is set on 8, the burst send signal generator 3 outputs a high level pulse of the read burst end signal BEND_RD at a time t5 that is after three cycles of the clock CLK from an input of the high level pulse of the read command RD_CMD.

Then, the first enable signal generator 40 receiving the high level pulse of the read burst end signal BEND_RD inactivates the read enable signal RD_EN to a low level state in sync with a rising edge of the inverted clock CLKB (not shown) after a half cycle of the clock CLK since the time t5.

The read enable signal RD_EN is maintained on its active state of a high level from the time t2, at which the high level pulse of the read command RD_CMD is input, until a half clock cycle since the time t5, i.e., during the read burst period. Thus, the first address buffer 42 outputs the read column address RAY<1:K> by buffering the decoded read address RDA<1:K> that is generated by decoding the address A<1: N> during the read burst period.

Afterward, when a high level pulse of the write command WT_CMD is input at a time t6, the second enable signal generator 60 activates the write enable signal WT_EN to a high level state.

Next, according as the burst length is set on 8, the burst send signal generator 3 outputs a high level pulse of the write burst end signal BEND_WT at a time t9 that is after three cycles of the clock CLK from an input of the high level pulse of the write command WT_CMD.

Then, the second enable signal generator 60 receiving the high level pulse of the write burst end signal BEND_WT inactivates the write enable signal WT_EN to a low level state in sync with a rising edge of the inverted clock CLKB after a half cycle of the clock CLK since the time t6.

The write enable signal WT_EN is kept on its active state of a high level from the time t6, at which the high level pulse of the write command WT_CMD is input, until a half clock cycle since the time t9, i.e., during the write burst period. Thus, the second address buffer 62 outputs the write column address WAY<1:L> by buffering the decoded write address WDA<1:L> that is generated by decoding the address A<1: N> during the write burst period.

The write column address WAY<1:L> output during the write operation mode is applied into the third decoder 92 and the fourth decoder 93 by way of the second address line AL2, or applied into the first decoder 90 and the second decoder 91 by way of the first address line AL1 after passing through the first repeater 7.

As described above, the semiconductor memory device according to this embodiment is operable in the same direction with the column address path, through which the write column address WAY<1:L> is transferred, during the write operation mode, and the data path through which data from the data input/output circuit 5 is transferred, because the write column address control circuit 6 and the data input/output circuit 5 are placed together at the second edge region EDGE2. Therefore, it is effective in reducing a skew due to a difference between propagation times of the write column address WAY<1:L> and data transferred from the data input/output circuit 5.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this invention as defined in the claims.

What is claimed is:

1. An address control circuit comprising:
   an enable signal generator configured to generate a read enable signal that is activated in response to a read command and configured to be inactivated in response to a burst end signal or a burst command, wherein the burst end signal appears in pulse patterns at times according to burst lengths determined by a mode register set that is executed at the initial operation, and the burst command acts as an interrupt signal that is applied in a pulse pattern for suspending a burst operation in a first burst period;
   an address decoder configured to generate a decoded address signal by decoding an address;
   an address buffer configured to output a read column address by buffering the decoded address signal in response to the read enable signal; and
   a write column address control circuit configured to generate a write column address from the address during a second burst period for a write operation mode.

2. The address control circuit according to claim 1, wherein the enable signal generator comprises:
   a first buffer configured to buffer the burst end signal in response to a clock;
   a first latch configured to latch an output signal of the first buffer;

a transmission element configured to transfer an output signal of the first latch;

a second buffer configured to buffer an output signal of the transmission element;

a switching circuit configured to control the second buffer to be driven in response to the burst command and the read command;

a driving element configured to drive an output node of the second buffer in response to the burst command; and a second latch configured to latch an output node of the second buffer to generate the read enable signal.

3. The address control circuit according to claim 1, wherein the address buffer comprises:

a buffering circuit configured to buffer the decoded address signal; and a switching element configured to control the buffering circuit to be driven in response to the read enable signal.

4. The address control circuit according to claim 1, wherein the write column address control circuit comprises:

an enable signal generator configured to generate a write enable signal during the second burst period;

an address decoder configured to generate a decoded address signal by decoding the address; and an address buffer configured to output the write column address by buffering the decoded address signal in response to the write enable signal.

5. The address control circuit according to claim 4, wherein the enable signal generator is configured to generate the write enable signal that is activated in response to a write command and inactivated in response to a burst end signal or a burst command.

6. The address control circuit according to claim 5, wherein the enable signal generator comprises:

a first buffer configured to buffer the burst end signal in response to a clock;

a first latch configured to latch an output signal of the first buffer;

a transmission element configured to transfer an output signal of the first latch;

a second buffer configured to buffer an output signal of the transmission element;

a switching circuit configured to control the second buffer to be driven in response to the burst command and the write command;

a driving element configured to drive an output node of the second buffer in response to the burst command; and a second latch configured to latch an output node of the second buffer to generate the write enable signal.

7. The address control circuit according to claim 4, wherein the address buffer comprises:

a buffering circuit configured to buffer the decoded address signal; and a switching element configured to control the buffering circuit to be driven in response to the write enable signal.

8. A semiconductor memory device comprising:

a command address input circuit comprising a receiving pad disposed at a first edge, the receiving pad receiving a command and an address;

a data input/output circuit comprising an I/O pad disposed at a second edge, the I/O for inputting or outputting data; and a write column address control circuit disposed at the second edge and configured to output a write column address from the address provided from the command address input circuit during a burst period for a write operation mode, wherein a path through which the write column address is transferred is the same with a path through which data from the data input/output circuit is transferred during the write operation mode.

9. The semiconductor memory device according to claim 8, wherein the command address input circuit and the data input/output circuit are disposed at different edge regions.

10. The semiconductor memory device according to claim 8, wherein the write column address control circuit comprises:

an enable signal generator configured to generate a write enable signal during the burst period;

an address decoder configured to generate a decoded address signal by decoding the address; and an address buffer configured to output the write column address by buffering the decoded address signal in response to the write enable signal.

11. The semiconductor memory device according to claim 10, wherein the enable signal generator is configured to generate the write enable signal when activated in response to a write command and the enable signal generator is configured to be inactivated in response to a burst end signal or a burst command.

12. The semiconductor memory device according to claim 11, wherein the enable signal generator comprises:

a first buffer configured to buffer the burst end signal in response to a clock;

a first latch configured to latch an output signal of the first buffer;

a transmission element configured to transfer an output signal of the first latch;

a second buffer configured to buffer an output signal of the transmission element;

a switching circuit configured to control the second buffer to be driven in response to the burst command and the write command;

a driving element configured to drive an output node of the second buffer in response to the burst command; and a second latch configured to latch an output node of the second buffer to generate the write enable signal.

13. The semiconductor memory device according to claim 10, wherein the address buffer comprises:

a buffering circuit configured to buffer the decoded address signal; and a switching element configured to control the buffering circuit to be driven in response to the write enable signal.

14. The semiconductor memory device according to claim 8, further comprising: a repeater configured to transfer a repeated address, which is generated by repeating the address input into the command address input circuit, to the write column address control circuit.

15. The semiconductor memory device according to claim 14, wherein the repeater comprises:

a drive signal generator configured to generate a pull-up signal and a pull-down signal in response to the address and a write enable signal; and a driver configured to drive the repeated address in response to the pull-up signal and the pull-down signal.

16. The semiconductor memory device according to claim 15, wherein the drive signal generator is configured to generate the pull-up signal that is activated when the address signal and the write enable signal are all activated, and to generate the pull-down signal that is activated when the address signal and the write enable signal are all inactivated.

17. A semiconductor memory device comprising:

a command address input circuit comprising a receiving pad receiving a command and an address;

a data input/output circuit comprising a I/O pad from which data is input or output;

a read column address control circuit configured to generate a read column address from the address provided from the command address input circuit during a first burst period for a read operation mode;

a write column address control circuit configured to generate a write column address from the address provided from the command address input circuit during a second burst period for a write operation mode; and a repeater coupled between a first address line, which receives the read column address, and a second address line which receives the write column address, wherein the first address line is coupled to a first column decoder configured to decode a signal of the first address line to select a memory cell of a first bank, and the second address line is coupled to a second column decoder configured to decode a signal of the second address line to select a memory cell of a second bank.

18. The semiconductor memory device according to claim 17, wherein the command address input circuit and the read column address control circuit are disposed at a first edge region, while the data input/output circuit and the write column address control circuit are disposed at a second edge region.

19. The semiconductor memory device according to claim 17, wherein the repeater is configured to repeat and transfer the read column address, which is transferred through the first address line, to the second address line during the read operation mode, and configured to repeat and transfer the write column address, which is transferred through the second address line, to the first address line during the write operation mode.

20. The semiconductor memory device according to claim 17, whereon the repeater comprises:
    a first drive signal generator configured to generate a first pull-up signal and a first pull-down signal in response to the read enable signal and the read column address that is transferred through the first address line;
    a first driver configured to drive the second address line in response to the first pull-up signal and the first pull-down signal;
    a second drive signal generator configured to generate a second pull-up signal and a second pull-down signal in response to the write enable signal and the write column address that is transferred through the second address line; and
    a second driver configured to drive the first address line in response to the second pull-up signal and the second pull-down signal.

21. The semiconductor memory device according to claim 20, wherein the first drive signal generator is configured to generate the first pull-up signal that is activated when both the read column address and the read enable signal are activated, and the first drive signal generator is configured to generate the first pull-down signal that is activated when either the read column address or the read enable signal are disabled.

22. The semiconductor memory device according to claim 20, wherein the second drive signal generator is configured to generate the second pull-up signal that is activated when both the write column address and the write enable signal are activated, and configured to generate the second pull-down signal that is activated when either the write column address or the write enable signal are disabled.

23. The semiconductor memory device according to claim 17, wherein the read column address control circuit comprises:
    an enable signal generator configured to generate a read enable signal during the first burst period;
    an address decoder configured to generate a decoded address signal by decoding the address; and
    an address buffer configured to output the read column address by buffering the decoded address signal in response to the read enable signal.

24. The semiconductor memory device according to claim 23, wherein the enable signal generator is configured to generate the read enable signal when activated in response to a read command and the enable signal generator is configured to be inactivated in response to either a burst end signal or a burst command.

25. The semiconductor memory device according to claim 23, wherein the address buffer comprises:
    a buffering circuit configured to buffer the decoded address signal; and
    a switching element configured to control the buffering circuit to be driven in response to the read enable signal.

26. The semiconductor memory device according to claim 17, wherein the write column address control circuit comprises:
    an enable signal generator configured to generate a write enable signal during the second burst period;
    an address decoder configured to generate a decoded address signal by decoding the address; and
    an address buffer configured to output the write column address by buffering the decoded address signal in response to the write enable signal.

27. The semiconductor memory device according to claim 26, wherein the enable signal generator is configured to generate the read enable signal when activated in response to a read command and the enable signal generator is configured to be inactivated in response to either a burst end signal or a burst command.

28. The semiconductor memory device according to claim 26, wherein the address buffer comprises:
    a buffering circuit configured to buffer the decoded address signal; and
    a switching element configured to control the buffering circuit to be driven in response to the write enable signal.

* * * * *